United States Patent [19]

Nakamura

[11] Patent Number: 4,556,181
[45] Date of Patent: Dec. 3, 1985

[54] FASTENER FOR ELECTRIC WIRES AROUND A PRINTED CIRCUIT BOARD

[75] Inventor: Toshinobu Nakamura, Tokyo, Japan

[73] Assignee: Shinagawa Shoko Co., Ltd., Tokyo, Japan

[21] Appl. No.: 455,833

[22] Filed: Jan. 5, 1983

[51] Int. Cl.⁴ ............................................. F16L 3/08
[52] U.S. Cl. ................................... 248/74.1; 248/73
[58] Field of Search ............... 248/74.1, 74.3, 74.4, 248/74.5, 73; 339/275 B, 275 RB, 17 B, 17 LC; 24/460, 531, 532, 563, 564

[56] References Cited

U.S. PATENT DOCUMENTS

| | | | |
|---|---|---|---|
| 3,173,639 | 3/1965 | Dunn | 248/74.1 X |
| 3,718,895 | 2/1973 | Reynolds et al. | 339/275 B X |
| 4,080,037 | 3/1978 | Kunkle et al. | 339/275 B X |
| 4,270,829 | 6/1981 | Wilson | 339/275 B X |
| 4,343,530 | 8/1982 | Leger | 339/275 B X |
| 4,347,999 | 9/1982 | Sato et al. | 248/74.1 X |

FOREIGN PATENT DOCUMENTS 365829  1/1932  United Kingdom ............... 248/74.5

Primary Examiner—J. Franklin Foss
Attorney, Agent, or Firm—Fidelman, Wolffe & Waldron

[57] ABSTRACT

A fastener for binding or fastening electric wires or other components on or around a printed circuit board easily and properly with complete electrical insulation. It comprises a flexible metal strip which is covered by a synthetic resin defining an electrical insulated fastening portion, except for one end which defines a tongue for soldering to the board. The tongue is inserted in a hole formed in the board and soldered to its rear surface, and the fastening portion is wound about a bundle of wires, or the like on the front surface of the board.

3 Claims, 7 Drawing Figures

FIG. 1
FIG. 2
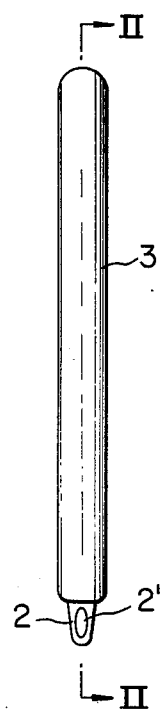
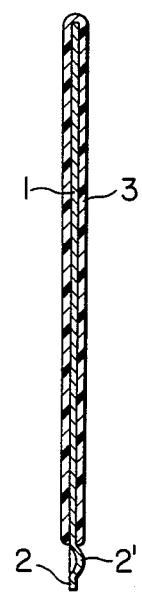
FIG. 3A   FIG. 3B   FIG. 3C
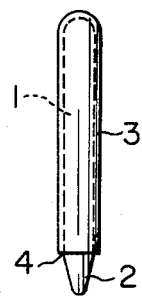
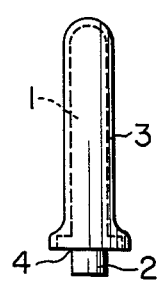
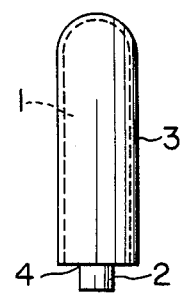

FASTENER FOR ELECTRIC WIRES AROUND A PRINTED CIRCUIT BOARD

BACKGROUND OF THE INVENTION

1. Field of the Invention

This invention relates to a fastener or binder for electric wires or components on or around a printed circuit board.

2. Description of the Prior Art

A conventional fastener or binder for securing a bundle of electric wires to a chassis, case, printed circuit borad, or the like comprises a strip of metal secured at one end to the chassis or the like by a screw or bolt and a nut, or by welding or soldering, or otherwise. The attachment of such a fastener to the printed circuit board or the like is, therefore, a troublesome and time-consuming job. It is attached to the front surface of the board, and occupies a relatively large area. The screw or bolt, or the welding or soldering material is exposed on the front surface of the board. Such exposure of the metal is entirely undesirable from the standpoint of electrical insulation.

Printed circuits have come to be used widely, and are expected to be used more widely in the future. Electric wires to or from a printed circuit board are usually laid along the board, and bound together by a nylon band or other string. No means is, however, known for fastening a bundle of wires to the board at appropriate intervals.

SUMMARY OF THE INVENTION

It is, therefore, an object of this invention to provide a simple and reliable fastener for electric wires around a printed circuit board.

It is another object of this invention to provide a fastener for electric wires which is highly reliable from the standpoint of electrical insulation.

It is a further object of this invention to provide a fastener for electric wires which is useful for simplifying the construction of a printed circuit board and reducing the cost of its manufacture.

The fastener of this invention comprises a flexible metal strip having a fastening or binding portion covered by a synthetic resin, and a tongue projecting from the fastening portion. The tongue extends through a hole in a printed circuit board, and is soldered to the rear surface thereof, while the insulated fastening portion stays over the front surface of the borad, and is wound about a bundle of electric wires to fasten it to the board. The tongue is soldered simultaneously when the various other components are soldered to the board.

BRIEF DESCRIPTION OF THE DRAWINGS

FIG. 1 is a front elevational view of a fastener embodying this invention;

FIG. 2 is a sectional view taken along the line II—II of FIG. 1;

FIGS. 3A to 3C are front elevational views showing other embodiments of this invention;

DETAILED DESCRIPTION OF THE INVENTION

Referring to FIGS. 1 and 2 of the drawings, a fastener embodying this invention comprises a flexible metal strip 1 having an appropriate length and an appropriate width. One end of the strip 1 defines a tongue 2 at which the fastener is soldered to a printed circuit board. The strip 1 is wholly except for the tongue 2 covered by a synthetic resin, such as soft vinyl chloride, which defines an electrically insulated fastening or binding portion 3. The tongue 2 projects from the fastening portion 3.

Figure 4:
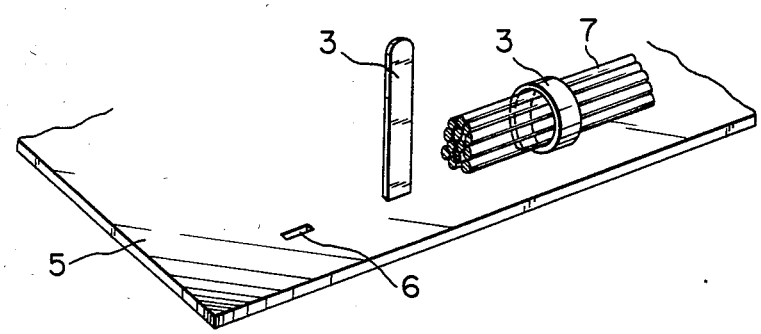
FIG. 4 is a fragmentary perspective view showing the mode in which the fastener of this invention is used for fastening a bundle of electric wires to a printed circuit board.
Figure 5:
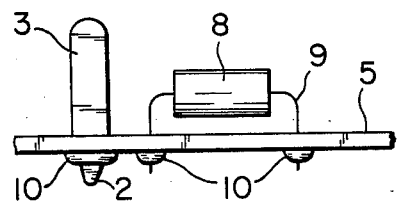
FIG. 5 is a front elevational view showing the mode in which the fastener of this invention is secured to a printed circuit board.

The tongue 2 is provided for insertion in a hole 6 formed in a printed circuit board 5 as shown in FIG. 4, and for soldering to the rear or lower surface of the board 5 as shown in FIG. 5. The board 5 may be formed with an appropriate number of holes 6 for attaching an appropriate number of fasteners. The tongue 2 is preferably curved or dimpled as shown at 2' in FIGS. 1 and 2 so that it may be tightly fitted in the hole 6.

Some modifications of the fastener, particularly its tongue 2, are shown in FIGS. 3A to 3C. For example, the tongue 2 shown in FIG. 3A is tapered, so that it may be still more easily inserted into the hole 6. The tongue 2 may be of any other shape if it is separated from the fastening portion 3 by a shoulder 4 adapted to rest on the front or upper surface of the board 5 when the tongue 2 has been inserted in the hole 6.

The fastening portion 3 may be wound about a bundle 7 of electric wires extending to or from the board 5, whereby the wires are neatly put together and fastened to the board 5, as shown in FIG. 4. The tongue 2 projecting downwardly from the board 5 is conveniently soldered to its lower surface at 10 simultaneously when other components, for example, lead wires 9 for an electrical component 8 as shown in FIG. 5, are soldered to the board 5 at 10.

Although the fastener of this invention has hereinabove been described as being applied for fastening a bundle of electric wires to a printed circuit board, it is also applicable for fastening other components, or for other electrical devices.

As is obvious from the foregoing description, the fastener of this invention is easy to attach to a printed circuit board or the like, since the tongue is solderable thereto simultaneously when the other components are soldered thereto. The fastener of this invention ensures complete electrical insulation from the electric wires or components thereby fastened, since only the electrically insulated fastening portion is exposed above the printed circuit board when it has been secured at the tongue thereto.

What is claimed is:

1. In a wire fastener comprising the combination of a strip means for holding at least one wire and bendable thereabout according to a wire diameter and an attachment means for mounting said strip means to a panel, the improvement comprising:
    said attachment means comprising a tongue integral with said strip means and insertable into an orifice of said board in order to temporarily mount and hold said fastener to said board in preparation for subsequent attachment to an underside of said panel by soldering said tongue to said panel, said strip means and attachment means being generally coplanar, said strip means providing a shoulder and said tongue having a dimple in order to provide temporary attachment of said fastener to said panel by sandwiching said panel between said shoulder and said dimple upon insertion of said tongue into said orifice and relative dimensions between said tongue and dimple and said orifice being sufficient to provide for a tight fit during insertion of said dimple in said orifice and for said sandwiching upon said insertion.

2. An improvement as in claim 1, and further comprising:
an electrically non-conductive material covering only said strip means.

3. An improvement as in claim 1, wherein said fastener further comprises:
as electrically insulative coating on said fastener, said coating terminating adjacent said tongue in order to provide said shoulder of said strip means.

* * * * *